(12) United States Patent
Wilson et al.

(10) Patent No.: US 9,727,669 B1
(45) Date of Patent: Aug. 8, 2017

(54) ANALYZING AND INTERPRETING USER POSITIONING DATA

(71) Applicant: GOOGLE INC., Mountain View, CA (US)

(72) Inventors: Marc P. T. Wilson, London (GB); Gemma Exton, London (GB); Sarah Fortune, London (GB); Andrew Eland, London (GB); Fiona E. Herring, London (GB)

(73) Assignee: GOOGLE INC., Mountain View, CA (US)

( * ) Notice: Subject to any disclaimer, the term of this patent is extended or adjusted under 35 U.S.C. 154(b) by 1045 days.

(21) Appl. No.: 13/917,409

(22) Filed: Jun. 13, 2013

Related U.S. Application Data

(60) Provisional application No. 61/669,449, filed on Jul. 9, 2012.

(51) Int. Cl.
*G06G 7/48* (2006.01)
*G06F 17/50* (2006.01)

(52) U.S. Cl.
CPC ................ *G06F 17/5009* (2013.01)

(58) Field of Classification Search
None
See application file for complete search history.

(56) References Cited

U.S. PATENT DOCUMENTS

| | | | | |
|---|---|---|---|---|
| 6,961,562 B2 * | 11/2005 | Ross | .................. | H04W 64/00 342/450 |
| 8,140,402 B1 * | 3/2012 | Mesaros | ............ | G06Q 30/0222 705/26.1 |
| 8,478,289 B1 * | 7/2013 | Lookingbill | .......... | H04W 4/021 455/2.01 |
| 2007/0042770 A1 * | 2/2007 | Yasui | ................. | H04M 3/42229 455/428 |
| 2008/0184245 A1 * | 7/2008 | St-Jean | .............. | G06K 9/00771 718/103 |
| 2009/0089149 A1 * | 4/2009 | Lerner | ................... | G01C 21/32 705/7.34 |
| 2010/0013931 A1 * | 1/2010 | Golan | ................ | G06K 9/00771 348/150 |
| 2010/0125872 A1 * | 5/2010 | Crow | .................... | G06Q 30/02 725/35 |

(Continued)

OTHER PUBLICATIONS

Reades Cellular Census: Explorations in Urban Data Collection Pervasive Computing, IEEE Computer Society, Jul. 2007.*

(Continued)

*Primary Examiner* — Omar Fernandez Rivas
*Assistant Examiner* — Cuong Luu
(74) *Attorney, Agent, or Firm* — Marshall, Gerstein & Borun LLP

(57) ABSTRACT

In a computer system, a pedestrian dataset that indicates position fixes for several portable devices is received, such that each portable device corresponds to a respective pedestrian. Raw heat scores for several geographic units of equal size are generated based on the pedestrian dataset, each raw heat score being indicative of a number of position fixes in the corresponding geographic unit. A selection of a geographic area that contains some of the geographic units is received, and normalized heat scores for these geographic units are generated based on at least some of the generated raw heat scores.

23 Claims, 13 Drawing Sheets

(56) References Cited

U.S. PATENT DOCUMENTS

| | | | | |
|---|---|---|---|---|
| 2011/0238762 | A1* | 9/2011 | Soni | G01C 21/3679 709/206 |
| 2012/0143713 | A1* | 6/2012 | Dittus | G06Q 30/08 705/26.3 |
| 2012/0290950 | A1* | 11/2012 | Rapaport | H04L 51/32 715/753 |
| 2013/0055309 | A1* | 2/2013 | Dittus | H04N 21/2668 725/35 |
| 2013/0101159 | A1* | 4/2013 | Chao | G06K 9/00771 382/103 |
| 2013/0151297 | A1* | 6/2013 | Zheng | G06Q 10/06 705/7.12 |
| 2013/0181993 | A1* | 7/2013 | Herring | G06T 11/206 345/440 |
| 2013/0267251 | A1* | 10/2013 | Khorashadi | H04W 4/023 455/456.3 |
| 2013/0331131 | A1* | 12/2013 | Fix | H04W 64/00 455/457 |
| 2013/0332068 | A1* | 12/2013 | Kesar | H04W 4/185 701/430 |
| 2013/0336138 | A1* | 12/2013 | Venkatraman | H04W 4/02 370/252 |
| 2014/0011522 | A1* | 1/2014 | Lin | H04W 4/023 455/456.2 |
| 2014/0082062 | A1* | 3/2014 | Bellver | G06F 17/3087 709/203 |
| 2014/0179347 | A1* | 6/2014 | Murray | G01S 5/0027 455/456.1 |
| 2014/0343994 | A1* | 11/2014 | Graff | G06Q 10/1095 705/7.19 |
| 2016/0014514 | A1* | 1/2016 | Triplett | H04N 21/23406 381/77 |
| 2016/0078193 | A1* | 3/2016 | Pinter | G06F 19/327 715/736 |

OTHER PUBLICATIONS

Lorenzo et al. Predicting Personal Mobility with Individual and Group Travel Histories Jul. 2011.*

Wirz et al. Inferring Crowd Conditions from Pedestrians' Location Traces for Real-Time Crowd Monitoring During City-Scale Mass Gathering IEEE 21 International WETICE, Jun. 25 2012.*

Andrew Breen Blog, "Young Rewired State," (2011). Retrieved from the Internet on Jul. 18, 2013: URL:http://andrew.breen.info/blog/archive/2011/08/07/young-rewired-state.aspx.

Arstechnica, "Hacking Festival Attracts 500 Aspiring Young Coders," (2012). Retrieved from the Internet on Jul. 18, 2013: URL:http://arstechnica.com/business/2012/06/hacking-festival-attracts-500-aspiring-young-coders/.

Dollár et al., "Pedestrian Detection: A Benchmark," Dept. of Electrical Engineering California Institute of Technology and Dept. of Computer Science TU Darmstadt (2009). Retrieved from the Internet on Jul. 18, 2013: URL:http://www.vision.caltech.edu/publications/dollarCVPR09pedestrians.pdf.

Heppenstall et al., Agent-Based Models of Geographical Systems, Springer Dordrecht Heidelberg, section 22.3.1 (2011).

Slate, "What's Your Walk Score?" (2013). Retrieved from the Internet on Jul. 18, 2013: URL:http://www.slate.com/articles/life/walking/04/walking_in_america_how_walk_score_puts_a_number_on_walkability_.html.

TerpNav Pedestrian Maps, University of Maryland (2013). Retrieved from the Internet on Jul. 18, 2013: URL:http://map.umd.edu/map/.

Wikipedia, "Heat Map," (2013). Retrieved from the Internet on Jul. 18, 2013: URL:http://en.wikipedia.org/wiki/Heat_map.

\* cited by examiner

ANALYZING AND INTERPRETING USER POSITIONING DATA

CROSS-REFERENCE TO RELATED APPLICATION

This application claims priority to U.S. Provisional Patent Application No. 61/669,449, filed on Jul. 9, 2012, and entitled "Analyzing and Interpreting User Positioning Data," the entire disclosure of which is hereby expressly incorporated by reference herein.

FIELD OF THE DISCLOSURE

The present disclosure relates to processing data indicative of movement of people and, more particularly, to generating effective heat maps for pedestrian traffic using such data.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

In general, identifying places in a city where people aggregate, recognizing streets with heavy pedestrian traffic, and otherwise understanding the flow of people in a city is important to various industries. For example, this information can be useful to tourists. Knowing the location of the city's hotspots is also important to many vendors. Various municipal organizations, such as police, can find pedestrian flow information useful as well.

Further, various computing devices, including many portable devices, now support software applications that display interactive digital maps. Some of these software applications, such as mapping and navigation applications, are developed primarily for displaying interactive digital maps. Other software applications, such as web browsers, may display interactive digital maps along with other content.

SUMMARY

Generally speaking, a heat map data generator analyzes anonymized positioning data collected from various sources to determine relative intensity of pedestrian traffic at various locations. The heat map data generator may generate heat map data that includes heat scores for cells of fixed size or road segments of fixed length, for example. Each heat score may reflect the number of personal portable devices passing through the cell or traveling along the road segment per unit of time such as day, week, month, etc. The heat map data generator also may normalize the heat score for a cell or road segment according to the number of cells or road segments being considered, as well as which of the neighboring cells or road segments are being considered at the same time. More generally, the heat map data generator may normalize the heat scores to provide meaningful, context-specific information to mapping applications, navigation applications, search applications, etc.

One embodiment of the techniques discussed below is a method for generating pedestrian heat map data that includes receiving a pedestrian dataset that indicates position fixes of multiple devices corresponding to different pedestrians, generating respective raw heat scores for several geographic units (e.g., "cells") of equal size based on the pedestrian set, each raw heat score being indicative of a number of position fixes in the corresponding geographic unit, receiving a selection of a geographic area that contains a subset of the several geographic units, and generating normalized heat scores for these geographic units to generate based on at least some of the generated raw heat scores.

Another embodiment of the techniques of the present disclosure is a computer-readable medium storing instructions for generating a context-specific pedestrian heat map. When executed on or more processors, the instructions cause the one or more processors to (i) receive several raw heat scores, where each raw heat score is indicative of intensity of pedestrian traffic at a corresponding one of a plurality of different locations. Further, the instructions cause the one or more processors to receive a selection of a context according to which a digital map of a geographic area including at least some of the plurality of locations is to be displayed and generate several normalized heat scores using the raw heat scores according to the selected context, where each normalized heat score is indicative of relative intensity of pedestrian traffic at the corresponding location. Still further, the instructions cause the one or more processors to generate the digital map according to the selected context for display on a display device and cause a visual representation of the plurality of normalized heat scores to be displayed on the digital map.

Yet another embodiment of the techniques of the present disclosure is a method in a computer system for generating pedestrian heat scores. The method includes receiving first positioning data that includes position tracks of respective portable devices, where each position track is made up of multiple successive position fixes, and receiving second positioning data that includes single position fixes of respective portable devices. The method also includes generating an anonymized pedestrian dataset using the first positioning data and the second positioning data, including analyzing the first positioning data to exclude position tracks data associated with a speed of movement of a portable device that exceeds a predefined pedestrian speed. The method further includes generating raw heat scores for multiple geographic units of a same size using the first anonymized positioning data and the second anonymized positioning data, including applying a first weight to the first anonymized positioning data and a second weight to the second anonymized positioning data.

Still another embodiment of the techniques of the present disclosure is a computer system including one or more processors and a computer-readable memory storing instructions of a pedestrian heat map data generator executable on the one or more processors. The pedestrian heat map generator includes a pedestrian dataset generator that, when executed on the one or more processors, processes (i) first positioning data that includes position tracks of respective portable devices, where each position track is made up of multiple successive position fixes, and (ii) second positioning data that includes single position fixes of respective portable devices, to generate an anonymized pedestrian dataset. The pedestrian heat map generator also includes a raw score generator that, when executed on the one or more processors, generates raw heat scores for different locations based on the anonymized pedestrian dataset, each raw heat score being indicative of intensity of pedestrian traffic at a corresponding one of the plurality of different locations. Further, the pedestrian heat map generator includes a normalized score generator that, when executed on the one or more processors, receives a context for presenting normalized heat scores and generates a plurality of normalized heat scores using the plurality of raw heat scores in accordance with the received context.

DETAILED DESCRIPTION

Figure 1:
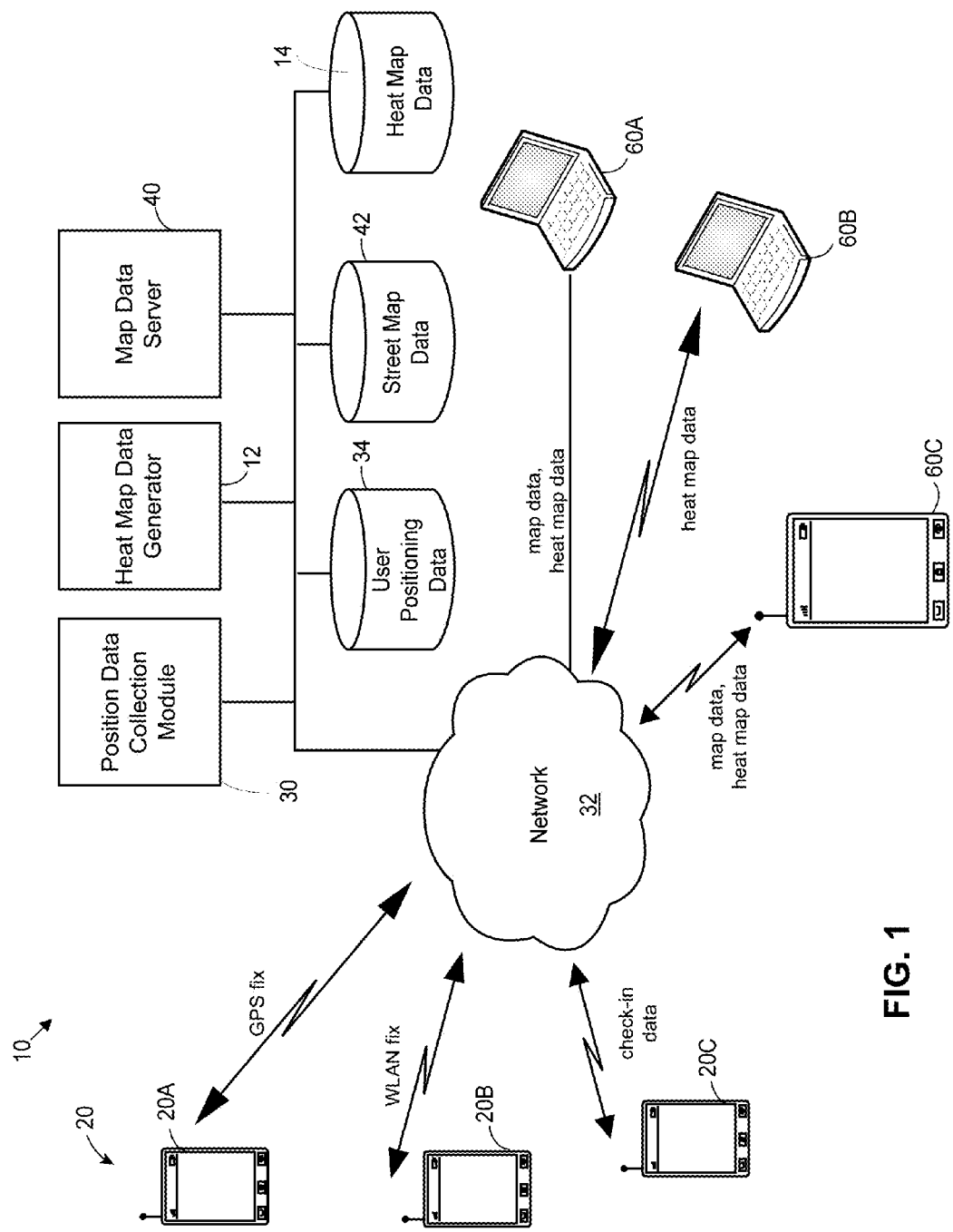
FIG. 1 is a block diagram of an example system in which a heat map data generator processes positioning data collected from multiple computing devices to automatically generate a heat map for a geographic area.

FIG. 1 illustrates an example embodiment of a system 10 in which a heat map data generator 12 analyzes anonymized positioning data collected from multiple computing devices 20 to generate meaningful, context-specific heat map data for a geographic area. The heat map data generator 12 may store the heat map data in a heat map database 14. In the example implementations discussed below, the heat map data pertains to pedestrian traffic. However, generally similar techniques also can be applied to bicycle traffic, for example, or other types of traffic.

The system 10 includes a positioning data collection module 30 configured to collect and process positioning data from various sources including the computing devices 20 in accordance with relevant privacy policies and user-selected configuration options. For example, a portable device 20A reports Global Positioning Services (GPS) position fixes, a portable device 20B reports Wireless Local Area Network (WLAN) position fixes, and a portable device 20C reports user check-ins at specified locations. Other sources of positioning data also may include various social networking applications, geocoded posts or "tweets," geotagged photographs, positioning requests such as those triggered by a user activating a control on a mapping application determine her current location, search requests, etc. Further, some users may subscribe to services that track "check-in" events at predetermined locations (e.g., "I am now at the coffee shop located at Main and Fifth") or periodic GPS updates, for example. In addition to portable devices, the computing devices 20 also may include non-portable devices such as shared computers set up at Internet cafés, for example, from which multiple users report their locations. The computing devices 20 communicate with the positioning data collection module 30 via a communication network 32, which may include a third-generation (3G) or a fourth-generation (4G) cellular network, for example. The positioning data collection module 30 may store the received information as anonymous positioning data in a user positioning database 34.

The reporting of positioning data may be periodic or sporadic (e.g., triggered by certain events). Accordingly, some of the positioning data may indicate paths or trajectories along which the corresponding portable computing devices travel, while other sources may indicate only single points at which the corresponding computing devices reported users' locations. Positioning data for some of the devices 20 may be organized into smaller datasets each corresponding to data collected over a time period of limited duration, such as 15 minutes.

The heat map data generator 12 may utilize the user positioning database 34 to generate raw and normalized heat scores for various geographic units, such as square cells of a fixed size or road segments of fixed length, for example. The heat map data generator 12 may store raw and/or normalized heat scores in the heat map database 14. Example implementation of the heat map data generator 12, as well as the heat map data which the heat map data generator 12 may generated, are discussed below with reference to FIG. 3, and various techniques which the map data generator 12 may implement are discussed with reference to FIGS. 4A, 4B, 5A-D, 6, and 7.

With continued reference to FIG. 1, a map data server 40 provides map data stored in a street map database 42 to various client devices for rendering and displaying digital maps. The client devices include, for example, a personal computer 60A coupled to the network 32 via a wired link, a portable personal computer 60B coupled to the network 32 via a wireless link, and a smartphone 60B also coupled to the network 32 via a wireless link. The street map database 42 may store map data in any suitable format including a raster or bitmap format, such as Portable Network Graphics (PNG), a vector graphics format (based on mathematical descriptions of geometric shapes), or any other suitable format. It is noted that the map data server 40 similarly may provide map data for any type of a geographic area, and that map data need not be limited to street map data. However, for ease of illustration, the map data server 40 in FIG. 1 provides only street map data to client devices.

The heat map data generator 12 can retrieve appropriate heat map data from the heat map database 14 and provide the heat map data to client devices. In some cases, the map data server 40 provides the heat map data to the client devices 60A-C along with map data. Depending on the implementation, the map data server 40 embeds the heat map data in the map data (e.g., displays dots, markers, highlights, modifies the thickness or color of roads) or provides the heat map data separately for overlaid display on the client device. In short, heat map data including raw scores, normalized scores, etc. can be provided together with map data for the corresponding geographic area or separately from the map data, and can be rendered at the client device or prior to delivery to the client device.

According to an example implementation, each of the positioning data collection module 30, the heat map data generator 12, and the map data server 40 is implemented in a respective server device equipped with one or more processors, a network interface, one or several memory modules, etc. However, according to other implementations, however, some or all of the components 30, 12, and 40 are implemented in a same server device. Further, according to some implementations, the system 10 includes multiple server devices operating in groups to process requests from client devices individually (e.g., based on availability) or in a distributed manner. For the purposes of this discussion, the term "server" may refer to an individual server device or a group of two or more server devices.

Figure 2:
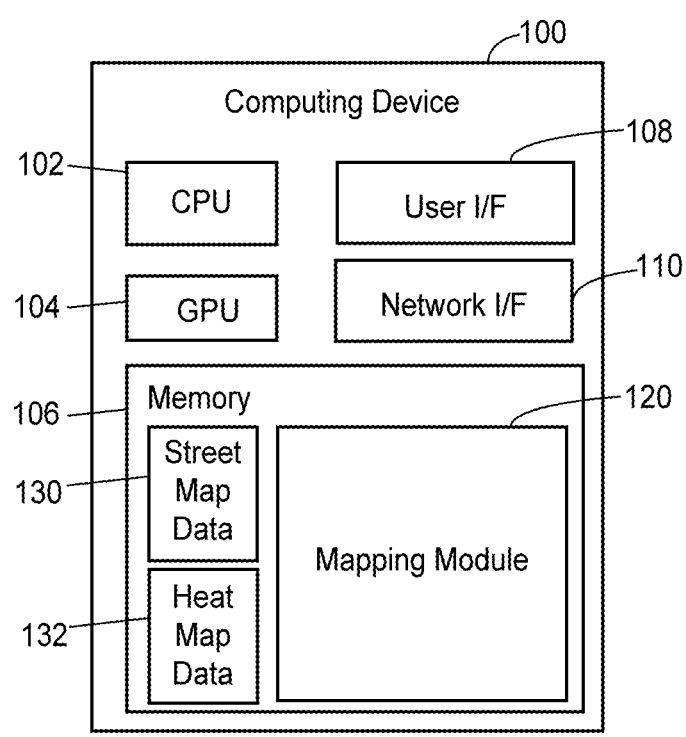
FIG. 2 is a block diagram of an example computing device that operates in the system of FIG. 1 to display heat map data as part a digital map of a geographic area.

Now referring to FIG. 2, a computing device 100 can operate as the client device 60A, 60B, or 60C in the system 10 of FIG. 1. The computing device 100 can be, for example, a laptop computer, a tablet computer, a smartphone, etc. In the embodiment illustrated in FIG. 1, the computing device 100 includes a central processing unit (CPU) 102, a graphics processing unit (GPU) 104, a computer-readable memory 106, a user interface 108, which may include an input device such as a keypad or a touchscreen as well as an output device such as a display or a touchscreen, and a network interface 110 configured to receive and transmit data over a wired or wireless communication link. The computing device 100 in some cases may be equipped with multiple processors, multiple memory modules, etc. The memory 106 is a computer-readable non-transitory storage device that may include both persistent (e.g., a hard disk) and non-persistent (e.g., RAM) memory components. The memory 106 stores instructions executable on the CPU 102 and/or the GPU 104 that make up a mapping software module 120. The memory 106 also stores street map data 130 and heat map data 132.

In a typical scenario, the mapping software module 120 renders a digital map using the street map data 130 and the heat map data 132 for display via the user interface 108. The mapping software module 120 according to various implementations operates as a separately executable software application, a plugin that extends the functionality of another software application such as a web browser, an application programming interface (API) invokable by a software application, etc. The instructions that make up the mapping software module 120 may be compiled and executable on the CPU 102 and/or the GPU 104 directly, or not compiled and interpreted by the CPU 20 at runtime.

Figure 3:
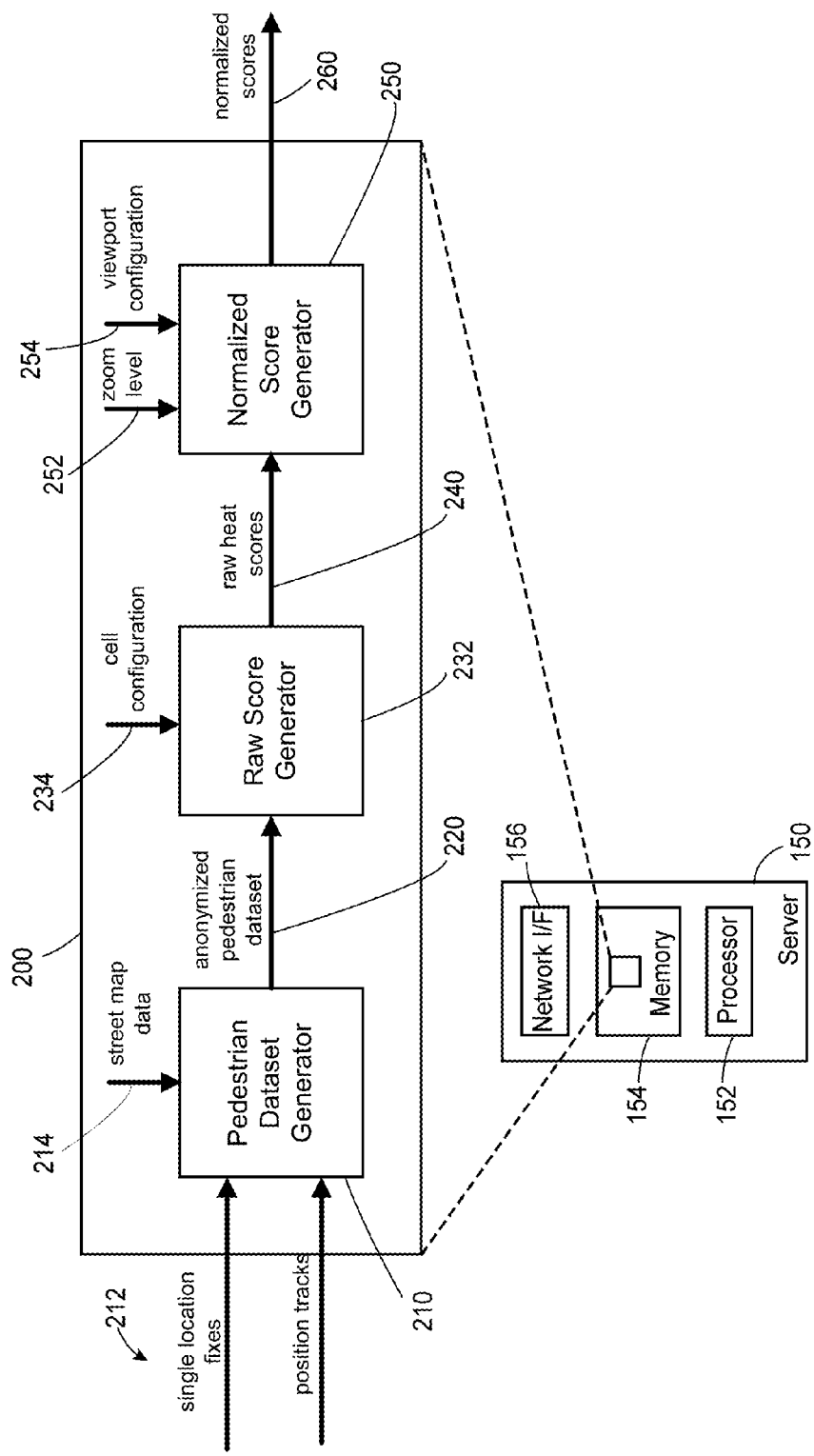
FIG. 3 is a block diagram of an example server device that implements a heat map data generator, which can operate in the system of FIG. 1.

FIG. 3 illustrates an example server device 150 having one or more processors 152, a network interface 156, and a computer-readable memory 154 storing instructions that implement a heat map data generator 200, which is similar to the heat map data generator 12 discussed above. In one embodiment, the map data generator 200 includes pedestrian dataset generator 210 configured to receive data 212 that includes single position fixes and position tracks (made up of successive position fixes from the same device) and street map data 214 that specifies the geometry of roads, streets, city squares, parks, river banks, and other places where people can walk. The map data generator 200 generates an anonymized pedestrian dataset 220 and provides it to a raw score generator 232. In addition to the anonymized pedestrian dataset 220, the raw score generator 232 may receive cell configuration data 234 that specifies the size of individual cells for which the raw score generator 232 generates raw heat scores 240. The raw score generator 232 provides raw heat scores 240 to a normalized score generator 250 to normalize the heat scores according to, for example, zoom level information 252 and viewport configuration 254. The normalized score generator 250 provides normalized heat scores 260 to client devices and/or a map data server.

It is noted that at least some of the components illustrated in FIG. 3 can be implemented in different server devices or even in client devices. For example, a normalized score generator generally similar to the normalized score generator 250, as well as other components of the heat map data generator 200, may be implemented in the computing device 100 (see FIG. 2) to more quickly generate context-specific normalized heat scores.

Next, operation of the heat map data generator 200 according to one embodiment is discussed in more detail. In particular, some of the techniques which the pedestrian dataset generator 210 may implement are discussed first, followed by a discussion of the raw score generator 230 with reference to FIG. 3 as well as FIGS. 4A and 4B. An example method which the normalized score generator 250 may implement is then discussed with reference to FIGS. 3, 5, and 6A-D.

Generating an Anonymized Pedestrian Dataset

Generally speaking, the pedestrian dataset generator 210 processes position fixes from various sources discussed above. Referring back to FIG. 1, the pedestrian dataset generator 210 may operate in heat map data generator 12 or, alternatively, in the position data collection module 20. Referring again to FIG. 3, the position track data included in the positioning data 212 may correspond to a sequence of GPS fixes, for example, each including three-dimensional coordinates of a location and the corresponding time stamp. The position track data is collected and provided to the pedestrian data generator 210 in accordance with relevant privacy policies and, where applicable, user-selected configuration options. The pedestrian dataset generator 210 may process position track data to eliminate position fixes that are more likely to be associated with automobile traffic than with pedestrian traffic. To this end, the pedestrian dataset generator 210 may analyze the speed at which a portable device appears to move, for example. If the speed is too high, the pedestrian dataset generator 210 may not include the corresponding data in the anonymized pedestrian dataset 220. Further, in some implementations and in accordance with the corresponding policy, the pedestrian dataset generator 210 uses the street map data 214 to "snap" position tracks to nearest streets, pedestrian paths, etc.

As indicated above, the pedestrian dataset generator 210 also may receive single position fixes as part of the positioning data 212 from social networking applications, microblogs, etc. The pedestrian dataset generator 210 similarly may use the street map data 214 to more accurately determine the reported position of the corresponding computing device.

For both position track data and single position fixes, the pedestrian dataset generator 210 generates an anonymized pedestrian dataset 220. For example, although the pedestrian dataset generator 210 retains an association between multiple GPS fixes in a single track, the dataset generator 210 does not associate these GPS fixes with an identity of the device that reported the GPS fixes, the name of the user of the device, or any other information that identifies the user. Moreover, additional steps are taken to prevent traceability of any one particular track to any one particular device. Thus, the pedestrian dataset 220 is an anonymized pedestrian dataset.

Generating Raw Heat Scores

Figure 4A:
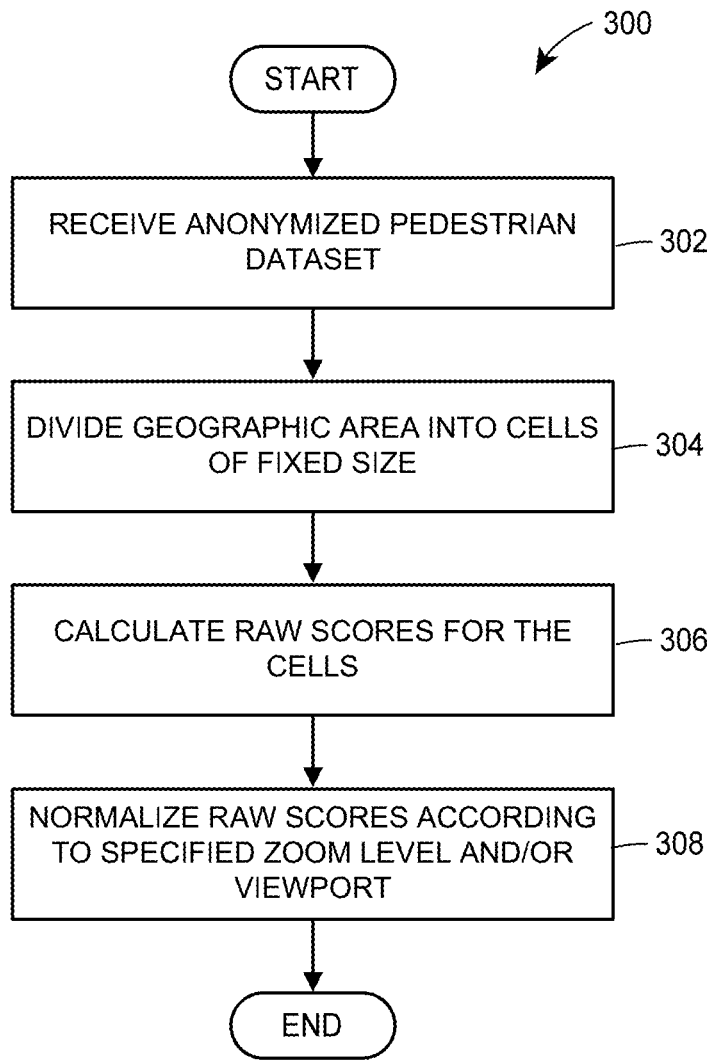
FIG. 4A is a flow diagram of an example method for generating heat scores for a set of cells of fixed size, which may be implemented in the system of FIG. 1.

To generate the raw heat scores 240, the raw score generator 230 may implement method 300 of FIG. 4A, for example. In addition to the raw score generator 230, other devices operating in a device generally similar to the server 150 may implement the method 300 (and/or the method 350 discussed below with reference to FIG. 4B). The method 300 begins at block 302, where an anonymized pedestrian dataset (such as the dataset 220) is received. At block 304, a geographic area is divided into multiple cells of fixed size. The cells in general can be of any desired size and shape, such as a square with side length 50 meters or a square with side length 10 kilometers. As illustrated in FIG. 3, the raw score generator 230 in one implementation receives the size of the cell as cell configuration data 232. The cells may be aligned with a geographic area in any desired manner. The cells in general need not (but can) align with road boundaries, political boundaries, or boundaries of map tiles, for example.

At block 306, a raw heat score for the individual cells is calculated. In one implementation, the raw heat score for a cell is calculated by adding the number of position tracks that pass through the cell and the number of single location fixes in the cell. In another implementation, the number of position tracks that pass through the cell is multiplied by a first weight factor, the number of single location fixes in the cell is multiplied by a second weight factor, and raw heat score is equal to the sum of these two products. The first weight factor may be larger than the second weight factor to assign more importance to the position tracks. More generally, any number of weights may be used for any number of corresponding sources of signals.

To achieve higher accuracy, the raw score for a certain cell may be adjusted if a position track passes through the neighboring cells in a way that indicates that the portable device also must have passed through the cell, even if no corresponding position fix is available. Similarly, if a certain position track is snapped to a road, and a position fixes are available for road segments A and C but not B disposed between A and C, the raw score for road segment B may be incremented.

Further, the raw score for a cell may be adjusted by recognizing outlier values corresponding to special events or other irregular occurrences. For example, when the raw score generator 230 generates a raw score for a certain location using position fixes collected over a period of one month, a special event such as a street festival may generate a high number of fixes that does not reflect the usual intensity of pedestrian traffic in the area. Accordingly, the raw score generator 230 may exclude outlier values when calculating raw heat scores. Additionally or alternatively, the raw score generator 230 may generate separate heat scores for such days using the techniques discussed below with reference to FIG. 7, for example.

Next, at block 308, the raw scores for several selected cells are normalized to provide a more meaningful indication of intensity of pedestrian traffic to a user or an automated service that uses the heat scores which the heat map data generator 200 generates. Because different cities, or even neighborhoods in the same city, have different population density, raw heat scores sometimes provide an inconvenient basis for comparison between different cells. For example, the raw score for a cell in Times Square in New York City may be much higher than the raw score for a cell of the same size in Paradeplatz in Zurich, although both places are the busiest, most popular places in the respective cities. Accordingly, the raw scores for several cells may be normalized at block 308 to generate indications of the same level of prominence in the corresponding locations.

According to an implementation, the flow proceeds to block 308 when a user or an automated service requests heat scores for a specified set of cells. When a mapping application requests heat scores, the request may specify the zoom level and/or the position of the viewport. Suitable normalization techniques, including those that include the use of a zoom level and viewport, are discussed in more detail below.

Figure 4B:
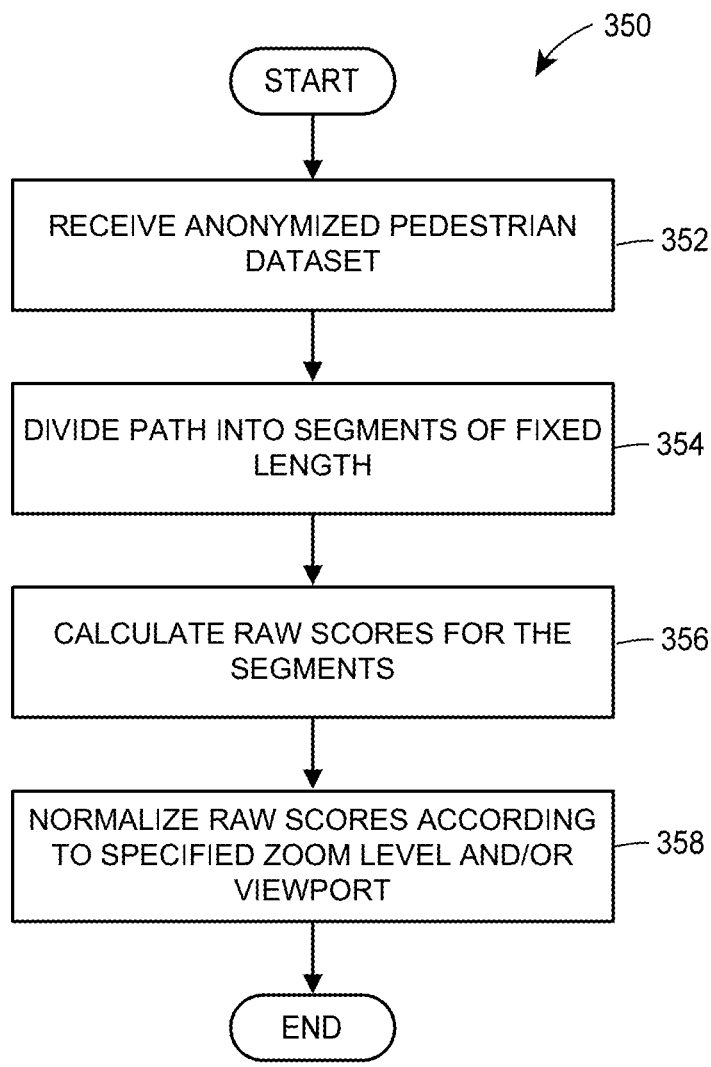
FIG. 4B is a flow diagram of an example method for generating heat scores for road segments of fixed length, which may be implemented in the system of FIG. 1.

Referring to FIG. 4B, a method 350 for generating heat scores for path segments of fixed length is generally similar to the method 300 of FIG. 4A, except that raw scores in this case are assigned to segments of roads, streets, etc. rather than to cells to determine which parts of the path are the busiest. Similar to block 302, an anonymized pedestrian dataset is received at block 352. At block 354, a path is divided into segments of equal length, and raw scores for the segments are calculated at block 356. The scores then are normalized at block 358.

As indicated above, counting and interpolating position fixes along path segments may be used to more accurately generate heat scores for cells through which the paths pass. However, software applications and users also may use raw and normalized heat scores that reflect intensity of pedestrian traffic along long paths.

Generating Normalized Heat Scores

The normalized score generator 250 or a similar module can implement various techniques to generate meaningful and accurate context-specific indications of intensity of pedestrian traffic. For example, the normalized score generator 250 in different scenarios can normalize the heat scores based on the zoom level, the position of the viewport, or both. Moreover, in some scenarios, the normalized score generator 250 generates multiple zoom level-specific normalized scores for the same cell.

Figure 5:
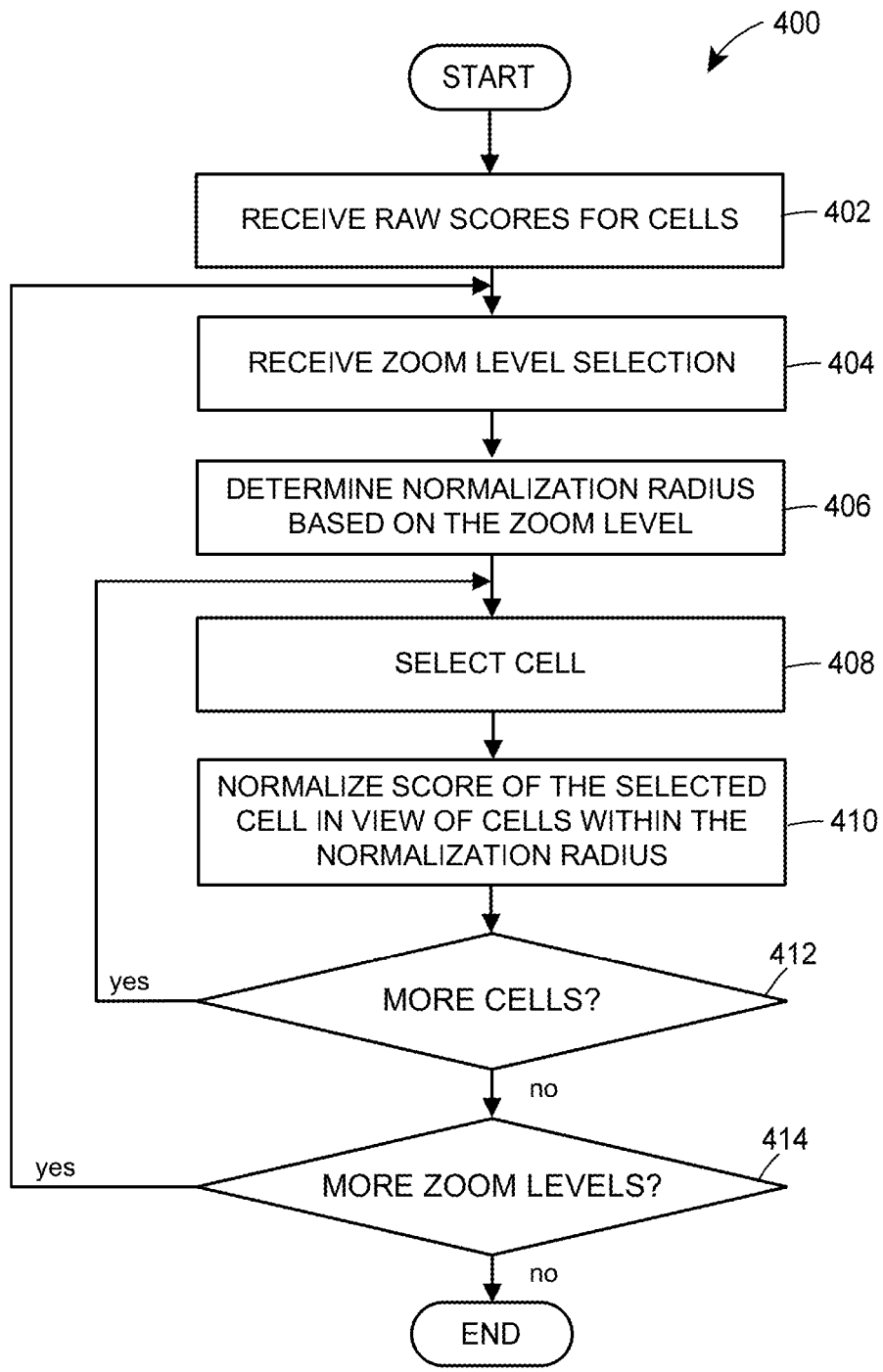
FIG. 5 is a flow diagram of an example method for normalizing heat scores based on a zoom level and a normalization radius, which may be implemented in the system of FIG. 1.

Referring to FIG. 5, a method 400 for normalizing heat scores based on a zoom level can be implemented in the normalized score generator 250. Similar to the methods 300 and 350, the method 400 can be implemented as a set of instructions stored on a computer-readable medium and executable by one or more processors. The method 400 begins at block 402, where raw heat scores for a group of cells are received. More specifically, a user of a mapping application may select the desired zoom level and position the viewport over a geographic area that corresponds to the group of cells. For example, the mapping application may display the downtown area of a small city within a square viewport, and the displayed area may approximately correspond to a 20×20 array of cells.

The zoom level is received at block 404, and a normalization radius corresponding to the zoom level is determined at block 406. The normalization radius determines how many cells surrounding a target cell are considered when generating a normalized score for the target cell. The units of the normalization radius can be cells or traditional units of length such as meters. For example, if the normalization radius is 1 kilometer from the center of a 50-meter cell, the method 400 will use all cells that are at least partially (or, in another implementation, fully) within a virtual circle with the center in the middle of the cell and the radius of 1,000 meters. The normalization radius may be relatively large at low zoom levels (i.e., when a map of a large geographic area fits in the viewport) and relatively low at high zoom levels (when a map of only a small geographic area fits in the viewport).

At block 408, an individual cell is selected. For example, the cell in the upper left corner of a viewport may be selected first. Normalization for the selected cell is carried out at block 410 using the cells within the normalization radius of the selected cell. Generally speaking, normalization produces a normalized raw score that is typically different from the raw heat score. Rather than reflecting the absolute number of position tracks, single location fixes, etc., a normalized score provides an indication of how the selected cell compares to the cells within the normalization radius of the selected cell. To generate a normalized heat score, a histogram of all the raw scores of all the cells within the normalization radius of the selected cell is constructed, according to one implementation. A normalized heat score is then selected depending on where the raw heat score falls along the histogram. For clarity, this approach is illustrated in FIGS. 6A-D.

At block 412, the method 400 determines whether the raw heat score of another cell should be normalized. If another cell requires normalization, the flow returns to block 408. The flow otherwise proceeds at block 414. At block 414, the method 400 determines whether normalization should be carried out at another zoom level. If other zoom levels are applicable, the flow returns to block 402. Otherwise, the method 400 completes.

In some scenarios, the cells within a viewport are considered together during the normalization process. More specifically, the heat score for an individual cell can be normalized in view of the cells that are within the viewport rather than those that are within the normalization radius. Thus, a normalized heat score for a cell in the corner of a viewport is affected by the cells in the viewport but is not affected by the cells outside the viewport that may be just as proximate. This approach is illustrated next in FIGS. 6A-D.

Figure 6A:
FIG. 6A is a diagram of an example cell grid and raw scores which the heat map data generator of FIG. 1 may assign to the corresponding cells.

Referring first to FIG. 6A, an example cell grid 500 includes cells A1 . . . E5. Each cell has a respective raw heat score that may reflect, in absolute terms, the number of position tracks and single position fixes passing through the cell. It is noted that although the score of 27 in cell A2 is significantly higher that the score of 12 in cell D4, cell A2 is surrounded by cells with relatively high raw heat scores (18 in cell B2, 15 in cell A1, etc.), whereas cell D4 is surrounded by cell with lower raw heat scores (4 in cell E4, 5 in cell D3, etc.). Thus, despite the difference in absolute heat scores, both of the cells A2 and D4 represent local maxima with respect to their immediate surroundings. Accordingly, when displayed independently, such as within different viewports, the cells A2 and D4 may have similar visual heat map attributes to contrast these cells with only the nearby cells. On the other hand, when displayed within the same viewport, the cells A2 and D4 should have different visual heat map attributes to reflect the difference between the scores of 27 and 12.

Figure 6B:
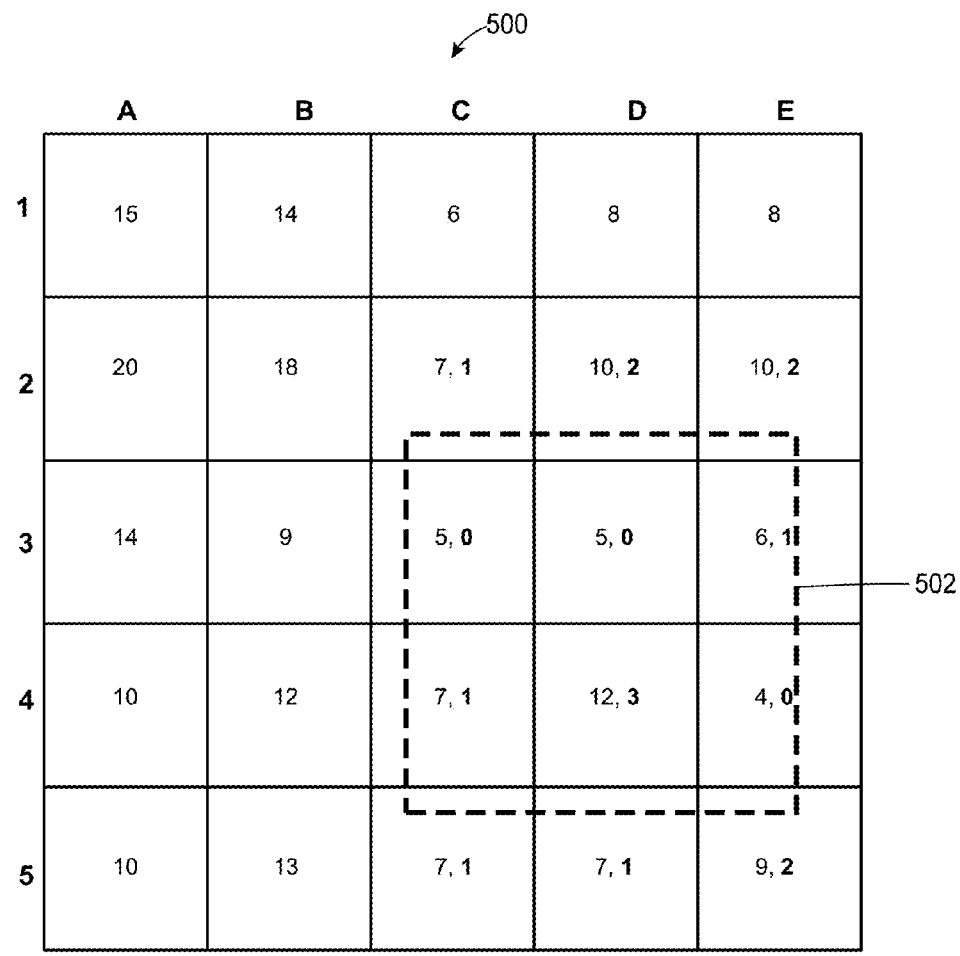
FIG. 6B is a diagram of an example viewport overlaying a portion of the cell grid of FIG. 6A and normalized scores which the heat map data generator of FIG. 1 may generate for some of the cells of the cell grid, along with a histogram that illustrates raw heat scores on the horizontal axis (with the height of each rectangle corresponding to the number of cells in the viewport having that particular raw score)
Figure 6B:
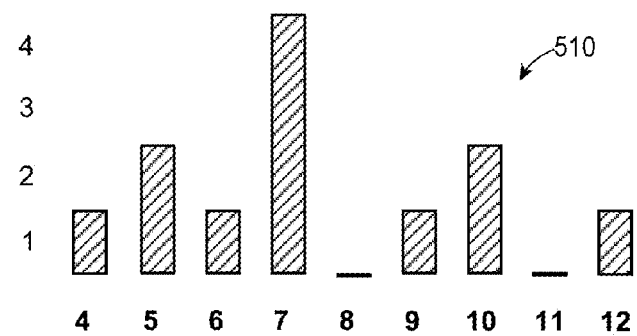

Now referring to FIG. 6B, a viewport 502 may at least partially cover cells C2-5, D2-5, and E2-5. According to an example implementation, the normalized score generator 250 builds a histogram 510, which reflects the distribution of raw heat scores in the cells that are within the viewport. It is noted that the normalized score generator 250 need not necessarily generate a visual representation of the histogram 510. Rather, the normalized score generator 250 may operate on a data structure stored in a computer-readable memory. For each of the cells in the square region with the corners at C2 and E5, the histogram 510 indicates where the raw heat score falls relative to the other raw heat scores in the square region. The normalized score generator 250 then may generate normalized heat scores for the cells in the square region, listed in bold in FIG. 6B, using any suitable statistical technique. Thus, the high raw heat score of 12 in this example is mapped to a normalized heat score of 3, the raw heat scores of 9 and 10 are mapped to a normalized heat score of 2, the raw heat scores of 6 and 7 are mapped to a normalized heat score of 1, and the low raw heat score of 5 is mapped to a normalized heat score of 0.

Referring back to FIG. 1, the map data server 40 can adjust the representation of roads, streets, city blocks, etc. using these normalized heat scores. Additionally or alternatively, client devices 60A-C can use the normalizes heat scores to locally modify the display of a digital map. Example visualization techniques are discussed in more detail below with reference to FIGS. 8A and 8B.

Figure 6C:
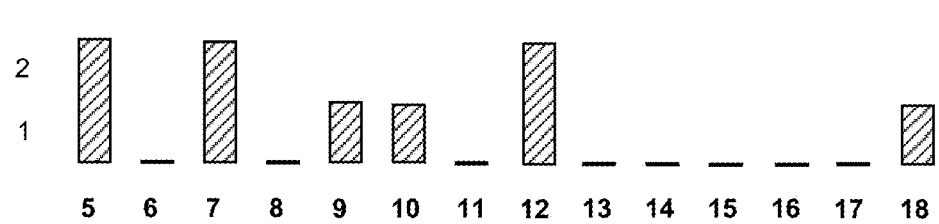
FIG. 6C is another diagram of the viewport overlaying a different portion of the cell grid of FIG. 6A.

FIG. 6C illustrates the cell grid 500 and the viewport 502 in a new position, which may be the result of a pan operation, for example. In this scenario, cells B2-4, C2-4, and D2-4 are in the viewport, and the normalized score generator 250 may construct a new histogram 520 using the raw heat scores in these cells. The normalized score generator 250 then may apply the same statistical technique to generate the normalized scores illustrated in bold in FIG. 6C. It is noted that cell D4, for example, is in the viewport 502 in the scenario in FIG. 6B and the scenario of FIG. 6C. However, the normalized heat score for cell D4 is different in these two cases because of the difference in the sets of cells used to normalize the heat scores. In other words, when the context in which cell D4 is considered changes, so does the normalized score for the cell, at least in some situations. Cell D4 in the scenario of FIG. 6C no longer corresponds to the busiest spot in the part of the city being covered by the digital map, as cell B2 now comes into view.

Figure 6D:
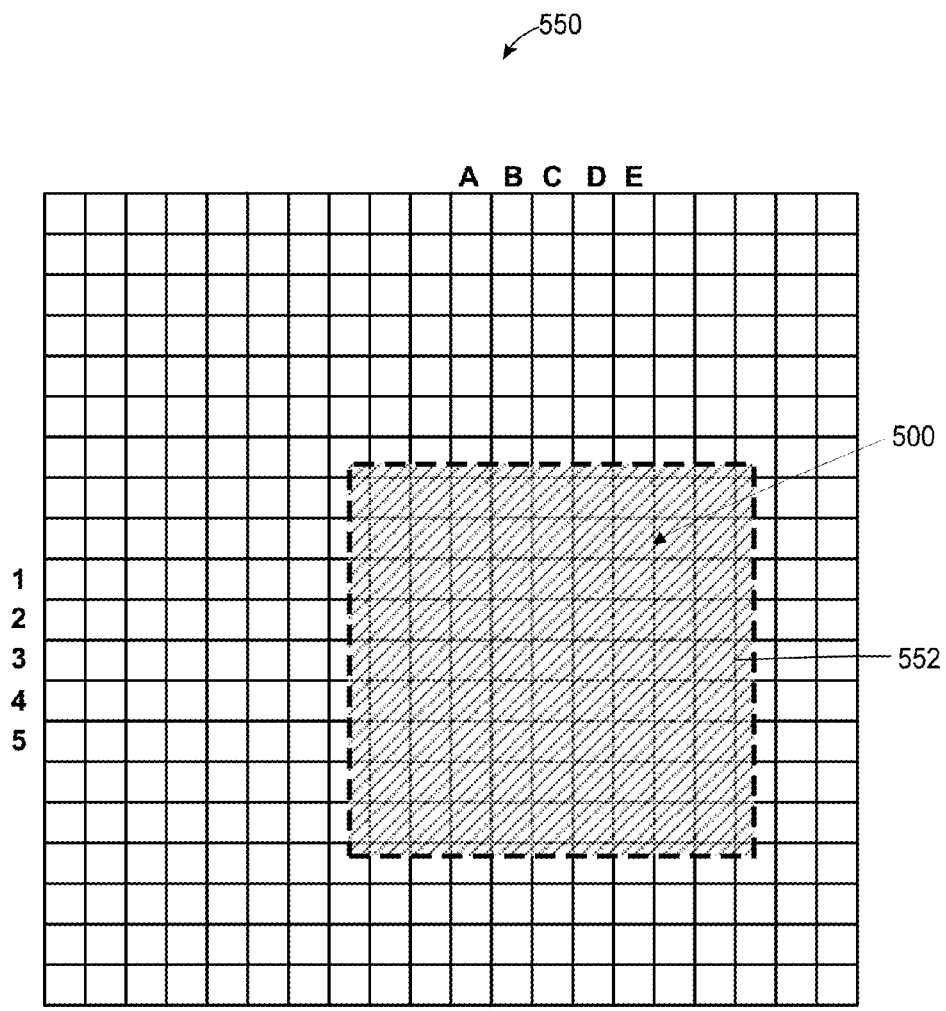
FIG. 6D is a diagram of a larger cell grid that includes the cell grid of FIG. 6A, and a viewport that encompasses a portion of the larger cell grid.

Now referring to FIG. 6D, a larger cell grid 550 includes the cell grid 500 illustrated in FIGS. 6A-C as well as other cells. Relative to the viewport 502, the viewport 552 covers a larger geographic area. In this scenario, the normalized scores for some or all of the cells in the region A1-E5 can again change because of a larger number of relevant cells and, accordingly, a larger number of relevant raw heat scores.

It is noted that normalized heat scores in the scenarios of FIGS. 6A-D depend both on the position of the viewport and the zoom level at which a digital map is being viewed via the viewport. Again, normalized scores in various implementations may depend on a zoom-specific normalization radius, a pair of parameters including the zoom level and viewport position, or any other suitable set of one or more parameters.

Generating Normalized Heat Scores in View of Time

Figure 7:
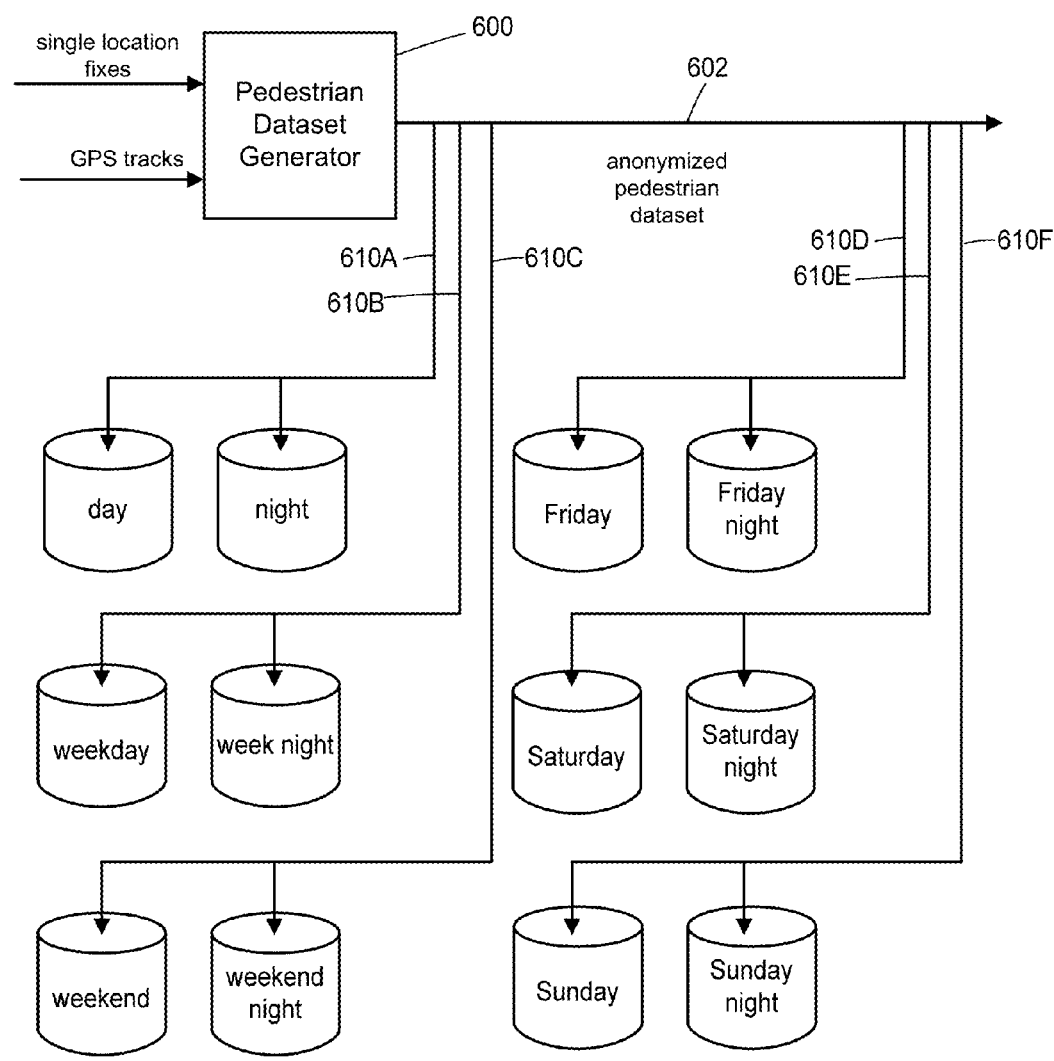
FIG. 7 is a block diagram of an example time-specific datasets which the heat map data generator of FIG. 1 may generate using an anonymized pedestrian dataset.

FIG. 7 illustrates another embodiment of a pedestrian dataset generator which the heat map data generator 200 or a similar module may use to generate a more robust anonymized pedestrian dataset. Similar to the pedestrian dataset generator 210 of FIG. 3, the pedestrian dataset generator 600 receives single position fixes and position tracks. The pedestrian dataset generator 600 generates an anonymized pedestrian dataset 602 that includes subsets 610A-F organized according to time. Because pedestrian traffic may vary greatly between daytime and nighttime, weekdays and weekends, etc., some mapping applications may provide heat scores for a particular time. For example, analysis of position fixes in London may indicate that in an area where there are many financial institutions, such as the City of London, the raw heat score may be very high during the day. At night, however, when people leave their offices and many go to Soho for dinner, the raw heat score for the City of London becomes significantly lower while the raw heat score for Soho goes up. To account for these differences, the anonymized pedestrian dataset 602 in FIG. 7 is divided into different "buckets" for the traffic that occurs during the day and during the night, on weekdays and week nights, weekends and weekend nights, Fridays and Friday nights, Saturday and Saturday nights, and Sunday and Sunday nights. More generally, the pedestrian dataset generator 600 may organize the anonymized pedestrian dataset 602 according to any number of subsets 610, each including two or more buckets. Even more generally, position fixes may be organized along any dimensions.

The approach illustrated in FIG. 7 allows applications to display heat map data and/or adjust local search results more accurately. For example, the raw score generator 232 may use the time-specific subsets 610A-F to separately generate raw scores for different days of the weeks, time of day, etc. When a user then searches for a restaurant for lunch on a Thursday, a software application using the anonymized pedestrian dataset 602 may suggest a restaurant in the City of London, but if the user searches for a restaurant for lunch on a Sunday, the software application may suggest Soho.

Further, the heat map data generator 200 or other software applications may consider longer periods of time over which positioning data is collected to generate indications of how cities are changing. For example, pedestrian datasets collected over relatively long periods of time (or "historical data") can be used to determine what parts of a city have become generally popular. Further, historical data can be used to automatically identify special events when a spike in pedestrian activity is detected. For example, the difference between today's dataset and the historical dataset may indicate that there is an event in Hyde Park today.

The heat map data generator 200 also may implement trend estimation to determine which businesses attract more customers and, if desired, generate corresponding graphic and/or text indicators for display on a digital map. For example, the heat map data generator 200 may determine that a pedestrian within a certain cell is probably visiting a certain store, a restaurant, or some other business in that cell. More specifically, a pedestrian's trajectory may pass through a business and "linger" at that location for some time (e.g., for more than a predetermined number of minutes), and the heat map data generator 200 accordingly may increment a heat score for that business. Thus, the heat map data generator 200 may generate cell-specific heat scores, business-specific heat scores, or both.

Presentation of Heat Map Data on a Client Device

Different approaches to visualizing heat map scores are considered next. In general, application of heat map data to a digital map may be implemented on a server device (e.g., the map data server 40), a client device (e.g., the computing device 100), or both. When heat map data is applied to a digital map on a server device, heat map data may be embedded into a raster map image or provided as a part of a description of a map image in a vector graphics format. When heat map data is applied to a digital map on a client device, the server device may provide the heat map data in any suitable format such a list of map elements in a vector graphics format for which line thickness or color must be changed, the boundaries of cells and the corresponding normalized heat scores for, coordinates of markers (such as dots, for example) to be displayed over a digital map, etc. More generally, heat map data can be applied to a digital map in the form of colors, shapes, line thickness, etc.

Figure 8A:
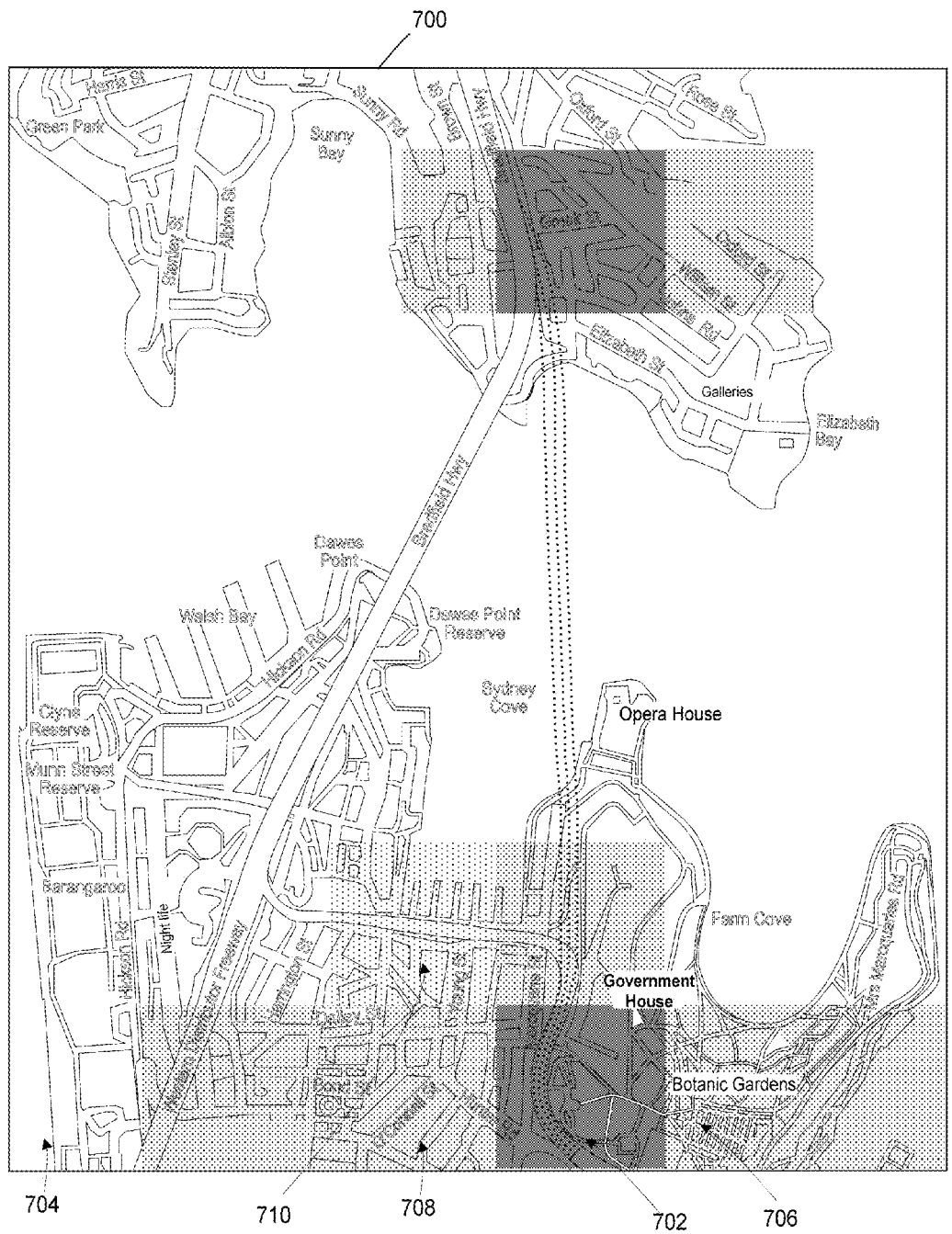
FIG. 8A is an example digital map that displays heat map data using color, which the computing device of FIG. 2 may generate.

As one example, FIG. 8A illustrates a digital map 700 which the mapping module 120 of the computing device 100 (see FIG. 2), for example, may display. The mapping module 120 illustrates a region 702 is illustrated using a certain color (e.g., red) to indicate the highest heat score for the context being displayed, and the mapping module 120 illustrates a region 704 using the opposite color (e.g., green) to indicate the lower heat score. Further, the mapping module 120 illustrates regions 706-110 using intermediate colors to indicate heat scores between the lowest heat score and the highest heat score. In this example, the mapping module 120 applies heat score-dependent colors to regions of the digital map corresponding to individual cells. Thus, the region 702 corresponds to a cell with a heat score S1, the region 704 corresponds to a cell with a heat score S2, etc. In other implementations, however, the mapping module 120 may apply colors to portions of the digital map 700 according to another suitable principle.

Figure 8B:
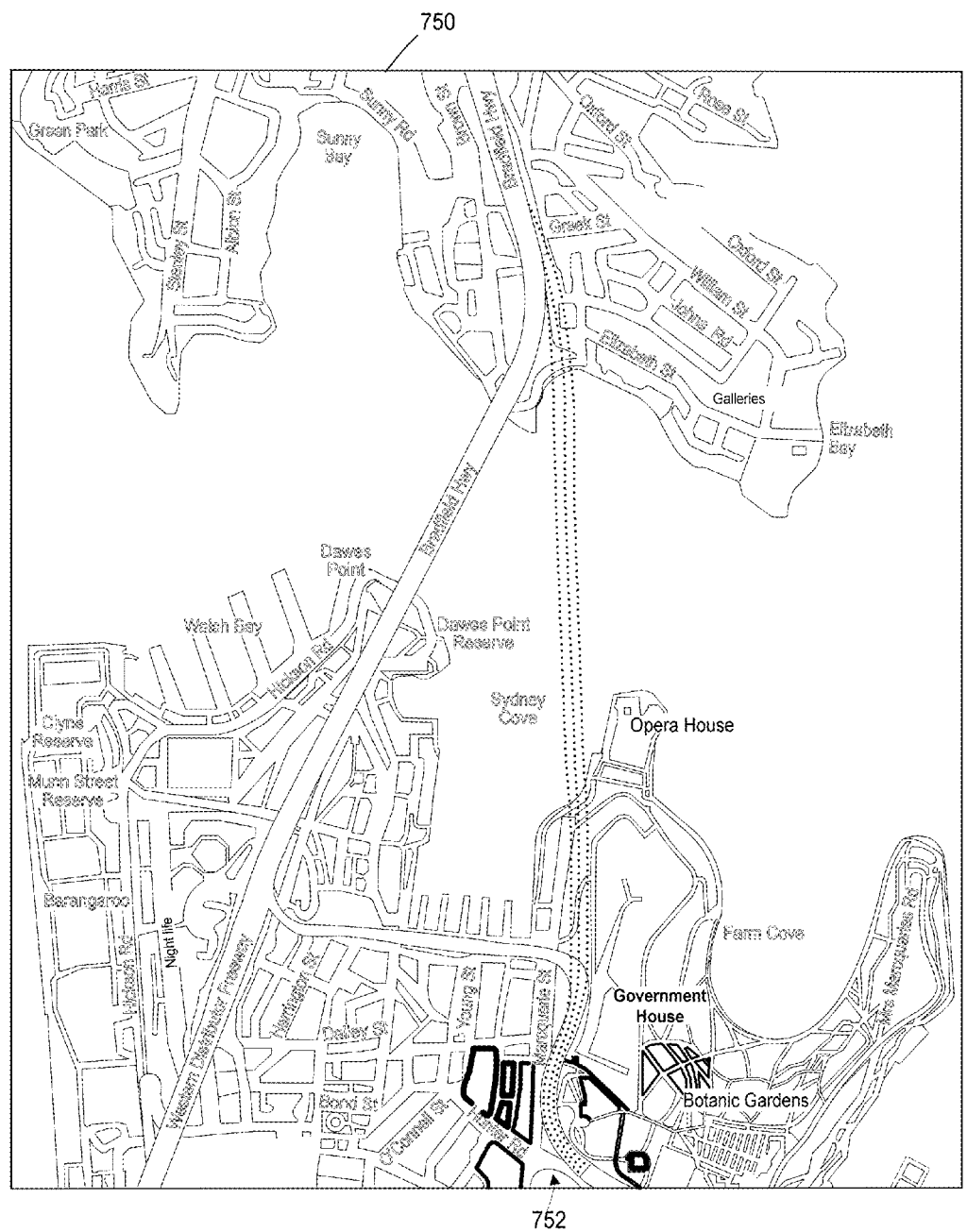
FIG. 8B is an example digital map that displays heat map data using line thickness, which the computing device of FIG. 2 may generate.

As another example, the mapping module 120 may display a digital map 750 and indicate heat scores for path segments using line thickness, as illustrated in FIG. 8B. In particular, in a region 752, busiest segments of streets or roads are illustrated using thick lines, and less busy segments of streets or roads are illustrated using thin lines.

Use of Heat Map Data in Local Search Applications

As indicated above, server and client applications can use heat map data not only to modify the display of a digital map but also to adjust local search results. For example, a user may search for restaurants in Zurich, and a local search module may rank or prioritize the search results according to the heat map data for Zurich. The local search module may be implemented in the map data server 40 (see FIG. 1) or the computing device 100 (see FIG. 2), for example. In some cases, the local search module is provided as a component of the mapping module 120, or the local search module and the mapping module 120 are provided as components of the same software application or service.

Further, the local search module may use the search term to automatically determine the zoom level to be used in normalizing the heat scores. Thus, if the user enters "restaurants Zurich" as the search term, the local search module may automatically select the zoom level such that a digital map of the entire city is in the viewport, select a normalization radius based on the zoom level, normalize raw heat scores using the raw heat scores of the cells within the normalization radius, and prioritize local search results based on these normalized raw heat scores. Thus, in response to the user entering "restaurants Zurich," the local search module may prioritize restaurants near one or more hotspots of Paradeplatz.

Additional Considerations

The following additional considerations apply to the foregoing discussion. Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter of the present disclosure.

Additionally, certain embodiments are described herein as including logic or a number of components, modules, or mechanisms. Modules may constitute either software modules (e.g., code stored on a machine-readable medium) or hardware modules. A hardware module is tangible unit capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field programmable gate array (FPGA) or an application-specific integrated circuit (ASIC)) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

Accordingly, the term hardware should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where the hardware modules comprise a general-purpose processor configured using software, the general-purpose processor may be configured as respective different hardware modules at different times. Software may accordingly configure a processor, for example, to constitute a particular hardware module at one instance of time and to constitute a different hardware module at a different instance of time.

Hardware and software modules can provide information to, and receive information from, other hardware and/or software modules. Accordingly, the described hardware modules may be regarded as being communicatively coupled. Where multiple of such hardware or software modules exist contemporaneously, communications may be achieved through signal transmission (e.g., over appropriate circuits and buses) that connect the hardware or software modules. In embodiments in which multiple hardware modules or software are configured or instantiated at different times, communications between such hardware or software modules may be achieved, for example, through the storage and retrieval of information in memory structures to which the multiple hardware or software modules have access. For example, one hardware or software module may perform an operation and store the output of that operation in a memory device to which it is communicatively coupled. A further hardware or software module may then, at a later time, access the memory device to retrieve and process the stored output. Hardware and software modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods or routines described herein may be at least partially processor-implemented. For example, at least some of the operations of a method may be performed by one or processors or processor-implemented hardware modules. The performance of certain of the operations may be distributed among the one or more processors, not only residing within a single machine, but deployed across a number of machines. In some example embodiments, the processor or processors may be located in a single location (e.g., within a home environment, an office environment or as a server farm), while in other embodiments the processors may be distributed across a number of locations.

The one or more processors may also operate to support performance of the relevant operations in a "cloud computing" environment or as an SaaS. For example, as indicated above, at least some of the operations may be performed by a group of computers (as examples of machines including processors), these operations being accessible via a network (e.g., the Internet) and via one or more appropriate interfaces (e.g., APIs).

The performance of certain of the operations may be distributed among the one or more processors, not only residing within a single machine, but deployed across a number of machines. In some example embodiments, the one or more processors or processor-implemented modules may be located in a single geographic location (e.g., within a home environment, an office environment, or a server farm). In other example embodiments, the one or more processors or processor-implemented modules may be distributed across a number of geographic locations.

Some portions of this specification are presented in terms of algorithms or symbolic representations of operations on data stored as bits or binary digital signals within a machine memory (e.g., a computer memory). These algorithms or symbolic representations are examples of techniques used by those of ordinary skill in the data processing arts to convey the substance of their work to others skilled in the art. As used herein, an "algorithm" or a "routine" is a self-consistent sequence of operations or similar processing leading to a desired result. In this context, algorithms, routines and operations involve physical manipulation of physical quantities. Typically, but not necessarily, such quantities may take the form of electrical, magnetic, or optical signals capable of being stored, accessed, transferred, combined, compared, or otherwise manipulated by a machine. It is convenient at times, principally for reasons of common usage, to refer to such signals using words such as "data," "content," "bits," "values," "elements," "symbols," "characters," "terms," "numbers," "numerals," or the like. These words, however, are merely convenient labels and are to be associated with appropriate physical quantities.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the description. This description should be read to include one or at least one and the singular also includes the plural unless it is obvious that it is meant otherwise.

Upon reading this disclosure, those of skill in the art will appreciate still additional alternative structural and functional designs for analyzing and interpreting user positioning data through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein.

What is claimed is:

1. A method in a computer system for generating pedestrian heat scores, the method comprising:
   receiving, by one or more processors, a pedestrian dataset that indicates position fixes for a plurality of portable devices, wherein each portable device corresponds to a respective pedestrian, including:
      receiving, for a first subset of the plurality of portable devices, position tracks each made up of successive position fixes from a same portable device, and
      receiving, for a second subset of the plurality of portable devices, single position fixes;
   receiving, by the one or more processors, a selection of a geographic area that contains a subset of the plurality of geographic units;
   generating, by the one or more processors, raw heat scores for a plurality of geographic units of equal size based on the pedestrian dataset, each raw heat score being indicative of a number of portable devices passing through a corresponding geographic unit, wherein for a target geographic unit included in the subset of the plurality of geographic units, generating the raw heat score includes:
      multiplying a number of position tracks passing through the target geographic unit by a first weight to generate a first product,
      multiplying a number of single location fixes in the target geographic unit by a second weight to generate a second product, and
      generating the raw heat score using the first product and the second product;
   generating, by the one or more processors, normalized heat scores for the subset of the plurality of geographic units based on at least some of the generated raw heat scores, to provide indications of relative intensity of pedestrian traffic at the corresponding geographic units, for use by a software application.

2. The method of claim 1, further comprising:
   generating a visual representation of the generated normalized heat scores; and
   causing the visual representation of the generated normalized heat scores to be displayed on a digital map of the selected geographic area.

3. The method of claim 2, wherein generating the visual representation of the normalized heat scores includes indicating different normalized heat scores using at least one of:
   (i) different colors,
   (ii) different line thicknesses, and
   (iii) different graphic markers.

4. The method of claim 1, wherein for the target geographic unit included in the subset of the plurality of geographic units, generating the raw heat score includes:
   determining whether a trajectory associated with one of the position tracks passes through the target geographic unit, wherein none of the position fixes included in the position track is in the target geographic unit, and
   in response to determining that the trajectory passes through the target geographic unit, automatically incrementing a raw score of the target geographic unit.

5. The method of claim 1, wherein each geographic unit is one of (i) a square cell of a fixed size or (ii) a road segment of a fixed length.

6. The method of claim 1, wherein to generate a normalized heat score for a target geographic unit included in the subset of the plurality of geographic units, the method includes:
   selecting a normalization radius, and
   generating the normalized heat score for the target geographic unit based on raw heat scores of geographic units that lie within the normalization radius of the target geographic unit.

7. The method of claim 6, further comprising displaying a digital map of the selected geographic area, wherein the normalization radius is selected based on a zoom level at which the digital map is being displayed.

8. The method of claim 1, wherein generating the normalized heat scores to generate a normalized heat score for a target geographic unit included in the subset of the plurality of geographic units, the method includes:
displaying, within a viewport, a digital map of the selected geographic area that includes the target geographic unit,
generating the normalized heat score for the target geographic unit based on raw heat scores of geographic units corresponding to the geographic area.

9. The method of claim 1, wherein for a target geographic unit included in the subset of the plurality of geographic units, generating a normalized heat score includes:
selecting a subset of the plurality of geographic units based at least on proximity to the target geographic unit,
generating a histogram using the raw heat scores of the selected geographic units, and
generating the normalized heat score using the histogram.

10. The method of claim 1, wherein receiving the pedestrian dataset includes receiving a plurality of time-specific subsets of the pedestrian dataset.

11. A non-transitory computer-readable medium having stored thereon instructions for generating a context-specific pedestrian heat map, wherein the instructions, when executed on one or more processors, cause the one or more processors to:
generate a plurality of raw heat scores, wherein each raw heat score is indicative of a number of people at a corresponding one of a plurality of different locations, defining an intensity of pedestrian traffic at that location, wherein for a target geographic unit included in the subset of the plurality of geographic units, generating the raw heat score includes:
multiplying a number of position tracks passing through the target geographic unit by a first weight to generate a first product,
multiplying a number of single location fixes in the target geographic unit by a second weight to generate a second product, and
generating the raw heat score using the first product and the second product;
receive a selection of a context according to which a digital map of a geographic area including at least some of the plurality of locations is to be displayed;
generate a plurality of normalized heat scores using the plurality of raw heat scores and according to the selected context, wherein each normalized heat score is indicative of relative intensity of pedestrian traffic at the corresponding location;
cause the digital map according to the selected context to be displayed on a display device; and
cause a visual representation of the plurality of normalized heat scores to be displayed on the digital map.

12. The non-transitory computer-readable medium of claim 11, wherein to receive the selection of the context, the instructions cause the one or more processors to receive an indication of a zoom level at which the digital map is to be displayed.

13. The non-transitory computer-readable medium of claim 11, wherein to receive the selection of the context, the instructions cause the one or more processors to receive an indication of a position of a viewport via which the digital map is to be displayed.

14. The non-transitory computer-readable medium of claim 11, wherein the plurality of different locations correspond to square cells of an equal size.

15. The non-transitory computer-readable medium of claim 11, wherein the selected context includes a selection of a zoom level, and wherein to generate the plurality of normalized heat scores, the instructions cause the one or more processors to:
select a normalization radius based on the selected zoom level, and
generate each of the plurality of normalized heat scores based on raw scores within the normalization radius of the location for which a normalized score is being generated.

16. A method in a computer system for generating pedestrian heat scores, the method comprising:
receiving, by one or more processors, first positioning data that includes position tracks of respective portable devices, wherein each position track is made up of a plurality of successive position fixes;
receiving, by the one or more processors, second positioning data that includes single position fixes of respective portable devices;
generating, by the one or more processors, an anonymized pedestrian dataset using the first positioning data and the second positioning data, including analyzing the first positioning data to exclude position tracks data associated with a speed of movement of a portable device that exceeds a predefined pedestrian speed; and
generating, by the one or more processors, raw heat scores for a plurality of geographic units of a same size using the first anonymized positioning data and the second anonymized positioning data, including applying a first weight to the first anonymized positioning data and a second weight to the second anonymized positioning data.

17. The method of claim 16, wherein generating the anonymized pedestrian dataset further includes using street map to correct the first positioning data.

18. The method of claim 16, wherein the single position fixes in the second pedestrian positioning data correspond to at least one of:
(i) check-in events at predefined locations,
(ii) geocoded posts,
(iii) geotagged photographs,
(iv) positioning requests, and
(iv) search requests.

19. The method of claim 16, further comprising generating normalized heat scores for a subset of the plurality of geographic units based on the raw heat scores within a radius of normalization of the geographic units included in the subset.

20. The method of claim 19, wherein the radius of normalization is selected according to a zoom level at which a geographic area including the subset of the plurality of geographic units is displayed.

21. The method of claim 19, further comprising:
generating a digital map for display on a display device; and
displaying indications of the normalized heat scores on the digital map.

22. A computer system comprising:
one or more processors; and
a computer-readable memory storing thereon instructions of a pedestrian heat map data generator executable on the one or more processors, the pedestrian heat map data generator including:
a pedestrian dataset generator that, when executed on the one or more processors, processes (i) first positioning data that includes position tracks of respective portable devices, wherein each position track is made up of a plurality of successive position fixes from a same portable device, and (ii) second positioning data that includes single position fixes of respective portable devices, to generate an anonymized pedestrian dataset;

a raw score generator that, when executed on the one or more processors, generates raw heat scores for a plurality of different locations based on the anonymized pedestrian dataset, each raw heat score being indicative of a number of people at a corresponding one of a plurality of different locations, defining an intensity of pedestrian traffic at that location, wherein for a target geographic unit included in the subset of the plurality of geographic units, generating the raw heat score includes (i) multiplying a number of position tracks passing through the target geographic unit by a first weight to generate a first product, (ii) multiplying a number of single location fixes in the target geographic unit by a second weight to generate a second product, and generating the raw heat score using the first product and the second product; and a normalized score generator that, when executed on the one or more processors, (i) receives a context for presenting normalized heat scores and (ii) generates a plurality of normalized heat scores using the plurality of raw heat scores in accordance with the received context.

23. The computer system of claim 22, wherein the received context specifies a zoom level at which a digital map of a geographic area including at least some of the plurality of different locations is generated.

* * * * *